United States Patent
Sivan et al.

(10) Patent No.: US 6,757,701 B2
(45) Date of Patent: Jun. 29, 2004

(54) APPARATUS AND METHOD FOR IMPLEMENTING A LINEARLY APPROXIMATED LOG MAP ALGORITHM

(75) Inventors: Noam Sivan, Ganey-Tikva (IL); Fabrice Aidan, Ra'anana (IL); Gregory Leshin, Askelon (IL)

(73) Assignee: Motorola, Inc., Schaumburg, IL (US)

( * ) Notice: Subject to any disclaimer, the term of this patent is extended or adjusted under 35 U.S.C. 154(b) by 203 days.

(21) Appl. No.: 09/923,007

(22) Filed: Aug. 3, 2001

(65) Prior Publication Data

US 2002/0018533 A1 Feb. 14, 2002

(30) Foreign Application Priority Data

Aug. 4, 2000 (EP) ............................................ 00116858

(51) Int. Cl.[7] ................................................ G06F 7/38
(52) U.S. Cl. ....................................................... 708/277
(58) Field of Search ................................ 708/277, 517

(56) References Cited

U.S. PATENT DOCUMENTS

| | | | | |
|---|---|---|---|---|
| 4,748,577 A | * | 5/1988 | Marchant | 708/277 |
| 5,801,974 A | * | 9/1998 | Park | 708/277 |
| 5,933,462 A | | 8/1999 | Viterbi et al. | 375/341 |
| 5,935,200 A | * | 8/1999 | Whittaker | 708/277 |
| 5,951,629 A | * | 9/1999 | Wertheim et al. | 708/277 |
| 2003/0053566 A1 | * | 3/2003 | He et al. | 375/340 |

OTHER PUBLICATIONS

Yung–Fu Cheg, Tony Ottosson: "Linearly approximated log–map algorithms for turbo decoding", 51$^{st}$ IEEE Vehicular technology conference proceedings, vol. 3, May 15–18 2000, pp. 2252–2256.

"Simplified log–map algorithm" research disclosure, Industrial opportunities Ltd. Havant, GB No. 421, May 1999, p. 612.

Robertson et al. "A comparision of optimal and sub–optimal map decoding algorithms operating in the log domain" proceedings of the conference on communications (ICC), US, New York, IEEE Jun. 18 1995 , pp. 1009–1013.

* cited by examiner

*Primary Examiner*—Tan V. Mai

(57) ABSTRACT

A method and apparatus for implementing a linearly approximated Log MAP algorithm, the implementation involves calculating MAX*(a(n),b(n)) function, the method having the steps of: (A) Receiving a(n), b(n) and a value DE; (B) calculating (a(n)+b(n)+DE)/2 and generating at least one intermediate result, the at least one intermediate result reflecting at least one relationship between at least two elements out of a(n), b(n) and DE; and (C) providing an MAX*(a(n),b(n)) result selected from a group comprising of a(n), b(n) or (a(n)+b(n)+DE)/2, the selection dependent upon the at least one intermediate result.

34 Claims, 3 Drawing Sheets

APPARATUS AND METHOD FOR IMPLEMENTING A LINEARLY APPROXIMATED LOG MAP ALGORITHM

FIELD OF THE INVENTION

Apparatus and method for implementing a linearly approximated Log MAP algorithm and especially an apparatus and method for implementing a linearly approximated Log MAP algorithm for turbo decoding and turbo equalization.

BACKGROUND OF THE INVENTION

Turbo Coding (i.e.—TC) is used for error control coding in digital communications and signal processing. The following references give some examples of various implementations of the TC: "Near Shannon limit error correcting coding and decoding: turbo-codes", by Berrou, Glavieux, Thitimajshima, IEEE International Conference of Communication. Geneva Switzerland, pp. 1064–1070, May 1993; "Implementation and Performance of a Turbo/MAP Decoder", Pietrobon, International Journal of Satellite Communication; "Turbo Coding", Heegard and Wicker, Kluwer Academic Publishers 1999.

MAP algorithm and soft output Viterbi algorithm (SOVA) are Soft Input Soft Output (i.e.—SISO) decoding algorithms that have gained wide acceptance in the area of communications. Both algorithms are mentioned in U.S. Pat. No. 5,933,462 of Viterbi et al.

The TC has gained wide acceptance in the area of communications, such as in cellular networks, modems, and satellite communications. Some turbo encoders consists of two parallel-concatenated systematic convolutional encoders separated by a random interleaver. A turbo decoder has two soft-in soft-out (SISO) decoders. The output of the first SISO is coupled to the input of the second SISO via a first interleaver, while the output of the second SISO is coupled to an input of the first SISO via a feedback loop that includes a deinterleaver.

A common SISO decoder uses either a maximum a posteriori (i.e.—MAP) decoding algorithm or a Log MAP decoding algorithm. The latter algorithm is analogues to the former algorithm but is performed in the logarithmic domain. Another common decoding algorithm is the max log MAP algorithm. The max log MAP is analogues to the log MAP but the implementation of the former involves an addition of correction factor. Briefly, the MAP finds the most likely information bit to have been transmitted in a coded sequence.

The output signals of a convolutional encoder are transmitted via a channel and are received by a receiver that has a turbo decoder. The channel usually adds noise to the transmitted signal.

During the decoding process a trellis of the possible states of the coding is defined. The trellis includes a plurality of nodes (states), organized in T stages, each stage has $N=2^{K-1}$ nodes, whereas T being the number of received samples taken into account for evaluating which bit was transmitted from a transmitter having the convolutional encoder and K is the constraint length of the code used for encoding. Each stage is comprised of states that represent a given time. Each state is characterized by a forward state metric, commonly referred to as alpha ($\alpha$ or a) and by a backward state metric, commonly referred to as beta ($\beta$ or b). Each transition from a state to another state is characterized by a branch metric, commonly referred to as gamma ($\gamma$).

Alphas, betas and gammas are used to evaluate a probability factor that indicates which signal was transmitted. This probability factor is commonly known as lambda ($\Lambda$). A transition from a stage to an adjacent stage is represented by a single lambda.

A function $MAX^*(a(n),b(n))$ is frequently used when alphas, betas and gammas are calculated. Conveniently, said calculation involves in a comparison of $a(n)$ and $b(n)$. Said elements $a(n)$ and $b(n)$ usually have real values. $MAX^*(a(n), b(n))$ equals $MAX(a(n), b(n))+Log(1+EXP\{-|a(n)-b(n)|\})$. The first portion of said equation is usually calculated. The calculation of the second portion is relatively complicated and time consuming. Usually an approximation of said second portion is calculated. Said approximation is either a linear approximation, a step approximation or a multi step approximation. A linear approximation method is described in "Linearity Approximated for Log-MAP Algorithms for Turbo Decoding", by Jung-Fu Cheng and Tony Ottoson. Said method suggests to approximate the second portion by a the following functions: $MAX\{0, (C-|a(n)-b(n)|/4\}$ and by: $MAX\{0, (C-|a(n)-b(n)|/8\}$. Both estimations provide relatively poor performances when $|a(n)-b(n)|$ is relatively small, and their implementation is relatively time consuming.

There is a need for providing a fast and high performance apparatus and method for implementing a linearly approximated Log MAP algorithm.

BRIEF DESCRIPTION OF THE DRAWINGS

While the invention is pointed out with particularity in the appended claims, other features of the invention are disclosed by the following detailed description taken in conjunction with the accompanying drawings, in which:

DETAILED DESCRIPTION OF THE DRAWINGS

Figure 1:
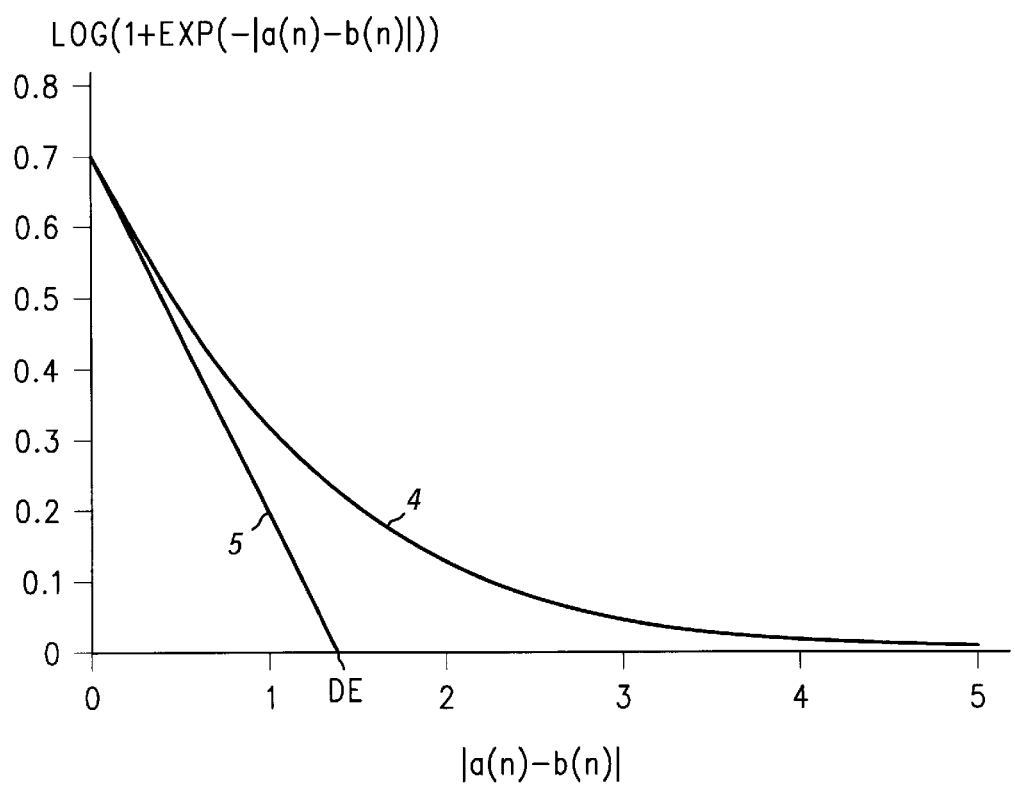
FIG. 1. is a schematic description of a portion of a $MAX^*(a(n),b(n))$ function and a linear approximation of said function, according to a preferred embodiment of the invention.

It should be noted that the particular terms and expressions employed and the particular structural and operational details disclosed in the detailed description and accompanying drawings are for illustrative purposes only and are not intended to in any way limit the scope of the invention as described in the appended claims.

The invention provides a fast and high performance apparatus and method for implementing a linearly approximated Log MAP algorithm. Said approximation is a linear approximation having a slope of −0.5, said slope providing an improved approximation when $a(n)$ is substantially equal to $b(n)$. Conveniently, method is executed during a single clock cycle.

The invention provides a fast and high performance apparatus and method for implementing a linearly approximated Log MAP algorithm.

The invention provides a method for implementing a linearly approximated Log MAP algorithm, said implementation involves calculating $MAX^*(a(n),b(n))$ function, said method comprising the steps of: (A) Receiving a(n), b(n) and DE; (B) Calculating (a(n)+b(n)+DE)/2 and generating at least one intermediate result, said at least one intermediate result reflecting at least one relationship between at least two elements out of a(n), b(n) and DE; and (C) Providing an MAX*(a(n),b(n)) result selected from a group comprising of a(n), b(n) or (a(n)+b(n)+DE)/2, said selection dependent upon the at least one intermediate result. Conveniently, the linearly approximated Log MAP algorithm is implemented in either an iterative decoding process or in an iterative equalization process.

The invention provides a method for implementing a linearly approximated Log MAP algorithm wherein a first intermediate result indicates whether an absolute value of a difference between a(n) and b(n) is greater than DE. A second intermediate result indicates whether a(n) is greater than b(n). Conveniently, the at least one intermediate result comprising of either a sign(a(n)−b(n)−DE) signal and a sign(b(n)−a(n)−DE) signal or of a sign(a(n)−b(n)) signal and a sign(|a(n)−b(n)|−DE) signal.

The invention provides a method for implementing a linearly approximated Log MAP algorithm wherein the MAX*(a(n),b(n)) result equals (I) MAX(a(n),b(n)) when |a(n)−b(n)| is not smaller than DE, and (II) (a(n)+b(n)+DE)/2 when |a(n)−b(n)| is smaller than DE. |a(n)−b(n)| is smaller than DE when (a(n)−b(n)−DE)<0 and (−a(n)+b(n)−DE)<0.

The invention provides a method for implementing a linearly approximated Log MAP algorithm wherein the MAX*(a(n),b(n)) result equals (I) a(n) when (a(n)−b(n)−DE)>0 and (b(n)−a(n)−DE)<0; (II) b(n) when (a(n)−b(n)−DE)<0 and (b(n)−a(n)−DE)>0; and (III) (a(n)+b(n)+DE)/2 when |a(n)−b(n)| is smaller than DE.

The invention provides a method for implementing a linearly approximated Log MAP algorithm wherein said method comprising of the steps of: (A) Receiving a(n), b(n) and DE; (B) Calculating (a(n)+b(n)+DE)/2, sign(a(n)−b(n), sign(a(n)−b(n)−DE) and sign(b(n)−a(n)−DE); (C) Calculating MAX(a(n),b(n)), sign(|a(n)−b(n)|−DE), said first calculation based upon a(n), b(n) and sign(a(n)−b(n)), said second calculation based upon sign(a(n)−b(n), sign(a(n)−b(n)−DE) and sign(b(n)−a(n)−DE); and (D) Providing an MAX*(a(n), b(n)) result selected from a group consisting of max(a(n), b(n)) and (a(n)+b(n)+DE)/2, dependent upon sign(|a(n)−b(n)|−DE).

The invention provides a method for implementing a linearly approximated Log MAP algorithm wherein, said method comprising the steps of: (A) receiving a(n), b(n) and DE; (B) calculating (a(n)+b(n)+DE)/2, sign(a(n)−b(n)−DE) and sign(b(n)−a(n)−DE); and (C) providing an MAX*(a(n), b(n)) result selected from a group consisting of a(n), b(n) and (a(n)+b(n)+DE)/2, dependent upon sign(a(n)−b(n)−DE) and sign(b(n)−a(n)−DE).

The invention provides an apparatus for implementing a linearly approximated Log MAP algorithm, said implementation involves calculating MAX*(a(n),b(n)) function, said apparatus comprising of: (A) Calculating means for receiving a(n), b(n) and DE; for calculating (a(n)+b(n)+DE)/2 and for generating at least one intermediate result, said at least one intermediate result reflecting at least one relationship between at least two elements out of a(n), b(n) and DE; and (B) Selecting means for providing an MAX*(a(n),b(n)) result selected from a group comprising of a(n), b(n) or (a(n)+b(n)+DE)/2, said selection dependent upon the at least one intermediate result. Conveniently, the linearly approximated Log MAP algorithm is implemented in an iterative decoding process or in an iterative equalization process.

The invention provides an apparatus for implementing a linearly approximated Log MAP algorithm wherein a first intermediate result indicates whether an absolute value of a difference between a(n) and b(n) is greater than DE and a second intermediate result indicates whether a(n) is greater than b(n). Conveniently, the at least one intermediate result comprising of a sign(a(n)−b(n)−DE) signal and a sign(b(n)−a(n)) signal. The at least one intermediate result comprising of a sign(a(n)−b(n)) signal and a sign(|a(n)−b(n)|−DE) signal.

The invention provides an apparatus for implementing a linearly approximated Log MAP algorithm that is adapted to calculate the MAX*(a(n),b(n)) function during a single clock cycle.

The invention provides an apparatus for implementing a linearly approximated Log MAP algorithm wherein the MAX*(a(n),b(n)) result equals MAX(a(n),b(n)) when |a(n)−b(n)| is not smaller than DE, and equals (a(n)+b(n)+DE)/2 when |a(n)−b(n)| is smaller than DE.

The invention provides an apparatus for implementing a linearly approximated Log MAP algorithm wherein the MAX*(a(n), b(n)) result equals a(n) when (a(n)−b(n)−DE)>0 and (b(n)−a(n)−DE)<0; wherein the MAX*(a(n), b(n)) result equals b(n) when (a(n)−b(n)−DE)<0 and (b(n)−a(n)−DE)>0; and wherein the MAX*(a(n), b(n)) result equals (a(n)+b(n)+DE)/2 when |a(n)−b(n)| is smaller than DE.

The invention provides an apparatus for implementing a linearly approximated Log MAP algorithm, the apparatus comprising of: (A) A first means for receiving a(n), b(n) and DE, calculating (a(n)+b(n)+DE)/2, sign(a(n)−b(n), sign(a(n)−b(n)−DE) and sign(b(n)−a(n)−DE); calculating MAX(a(n),b(n)), sign(|a(n)−b(n)|−DE), said first calculation based upon a(n), b(n) and sign(a(n)−b(n)), said second calculation based upon sign(a(n)−b(n), sign(a(n)−b(n)−DE) and sign(b(n)−a(n)−DE); and (B) a second means for providing an MAX*(a(n),b(n)) result selected from a group consisting of max(a(n), b(n)) and (a(n)+b(n)+DE)/2, dependent upon sign(|a(n)−b(n)|−DE). Conveniently, said apparatus is adapted to calculate MAX*(a(n),b(n)) function during three clock cycles. The MAX*(a(n),b(n)) result equals MAX(a(n),b(n)) when |a(n)−b(n)| is not smaller than DE, and equals (a(n)+b(n)+DE)/2 when |a(n)−b(n)| is smaller than DE.

The invention provides an apparatus for implementing a linearly approximated Log MAP algorithm, the apparatus comprising (A) First means for receiving a(n), b(n) and DE, calculating (a(n)+b(n)+DE)/2, sign(a(n)−b(n)−DE) and sign(b(n)−a(n)−DE); and (B) Second means for providing an MAX*(a(n),b(n)) result selected from a group consisting of a(n), b(n) and (a(n)+b(n)+DE)/2, dependent upon sign(a(n)−b(n)−DE) and sign(b(n)−a(n)−DE). Conveniently, the apparatus is adapted to calculate a MAX*(a(n), b(n)) function in two clock cycles. The MAX*(a(n), b(n)) result equals a(n) when (a(n)−b(n)−DE)>0 and (b(n)−a(n)−DE)<0; wherein the MAX*(a(n), b(n)) result equals b(n) when (a(n)−b(n)−DE)<0 and (b(n)−a(n)−DE)>0; and wherein the MAX*(a(n), b(n)) result equals (a(n)+b(n)+DE)/2 when |a(n)−b(n)| is smaller than DE.

For convenience of explanation, the following description relates to turbo decoding. The invention is not limited to said decoding method. For example said invention is also applied in various detection processes such as equalization processes.

|a(n)−b(n)| is an absolute value of a difference between a(n) and b(n).

EXP{−|a(n)−b(n)|} equals e by the power of −|a(n)−b(n)|.

FIG. 1 is a graph illustrating a portion of a MAX*(a(n), b(n)) versus an absolute value of a difference between a(n)

and b(n). Said graph further illustrates a linear approximation AP(n) of said portion. Said portion equals Log(1+ EXP{−|a(n)−b(n)l}). Curved line 4 illustrates portion Log (1+EXP{−|a(n)−b(n)|}), while line 5 illustrates a linear approximation of said portion. The slope of said linear approximation substantially equals −0.5. AP(n)=MAX{0, (DE (a(n)−b(n))/2)}. Preferably DE=2*LOG(2).

Said linear approximation provides superior performances when the difference between a(n) and b(n) is very small. Furthermore, such an approximation allows to speed the calculation of the MAX* function, as further illustrated in FIGS. 2–3.

Figure 2:
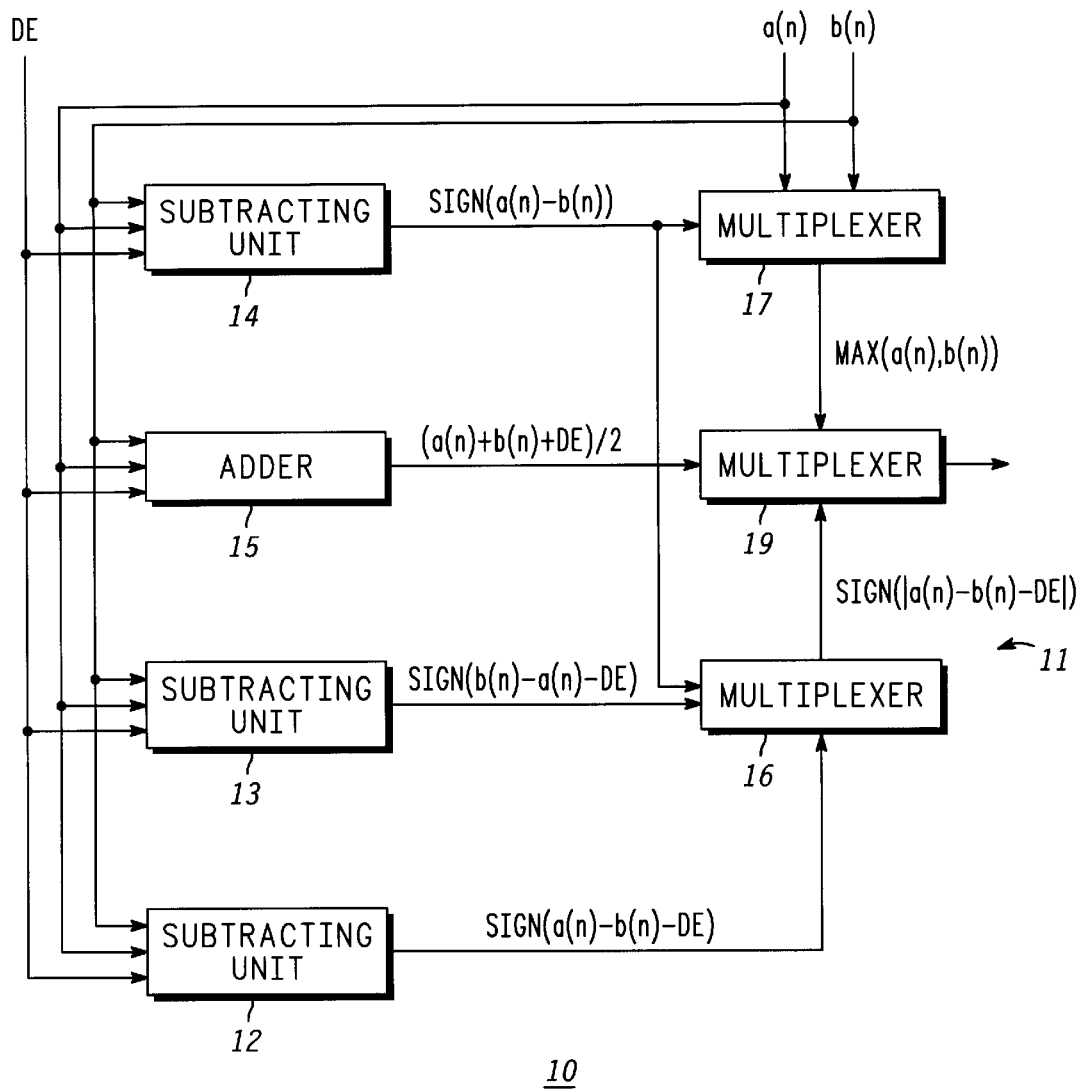
FIGS. 2–3 are schematic diagrams illustrating two apparatuses for implementing a linearly approximated Log MAP algorithm, according to a preferred embodiment of the invention.

Referring to FIG. 2 illustrating an apparatus 10 for implementing a linearly approximated Log MAP algorithm, according to a preferred embodiment of the invention.

Apparatus 10 implements the following equations:

$$MAX^*(a(n), b(n)) = MAX(a(n), b(n)) \text{ when } |a(n)-b(n)| \text{ is not smaller than DE.} \quad [1]$$

$$MAX^*(a(n), b(n)) = (a(n)+b(n)+DE)/2 \text{ when } |a(n)-b(n)| \text{ is smaller than DE.} \quad [2]$$

Apparatus 10 allows to calculate in parallel the following values: MAX(A(n), b(n)); (a(n)+b(n)+DE)/2 and the sign of (|a(n)−b(n)| −DE) and then to determine, according to said sign) which of the first two values to provide as a result of the calculation.

Accordingly, apparatus 10 comprises of first means 11 for calculating the following values: MAX(A(n), b(n)); (a(n)+ b(n)+DE)/2 and the sign of (|a(n)−b(n)| −DE) and of a second means 19 to determine which of the first two elements to provide as a result, according to said sign.

First means 11 comprising of first to third subtracting units 12–14, adder 15 and two multiplexers 16 and 17. First and second subtracting units 12–13 and adder 15 receive a(n), b(n) and DE. Third subtracting unit 14 receives a(n) and b(n) and generates sign(a(n)−b(n)). Sign(a(n)−b(n)) is provided a a control signal to first and second multiplexers 16 and 17. Second multiplexer 17 receives a(n) and b(n) and selects the greater element out of them, in response to sign(a(n)−b(n)). Therefore, second multiplexer 17 generates MAX(a(n), b(n)) and provide it to second means 19. Adder 15 receives a(n), b(n) and DE and provides to second means 19 (a(n)+b(n)+DE)/2. The division by two is a shift of the bit position by one. Second means receives a control signal sign(|a(n)−b(n)|−DE) and accordingly selects whether to provide MAX(a(n),b(n)) provided by second multiplexer 17 or (a(n)+b(n)+DE)/2, provided by first multiplexer 16. First subtracting unit 12 receives a(n), b(n) and DE and generates sign(b(n)−a(n)−DE). Second subtracting unit 13 receives a(n), b(n) and DE and generates sign(a(n)−b(n)−DE). Both sign signals are provided to first multiplexer 16, that selects the appropriate sign signal according to sign(a(n)−b(n)) provided by third subtracting unit 14.

Conveniently, apparatus 10 performs said calculation in a single clock cycle.

Figure 3:
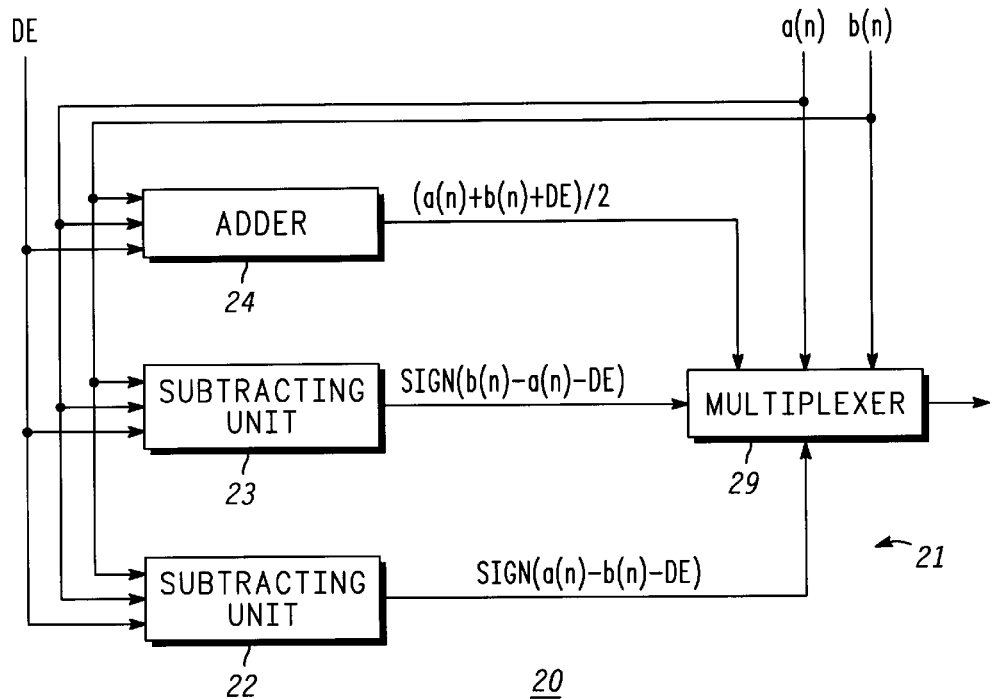

Referring to FIG. 3 illustrating an apparatus 20 for implementing a linearly approximated Log MAP algorithm, according to a preferred embodiment of the invention.

Apparatus 20 implements the following equations:

$$MAX^*(a(n), b(n)) = a(n) \text{ when } (a(n)-b(n)-DE)>0 \text{ and } (b(n)-a(n)-DE)<0. \quad [3]$$

$$MAX^*(a(n), b(n)) = b(n) \text{ when } (a(n)-b(n)-DE)<0 \text{ and } (b(n)-a(n)-DE)>0. \quad [4]$$

$$MAX^*(a(n), b(n)) = (a(n)+b(n)+DE)/2 \text{ when } |a(n)-b(n)| \text{ is smaller than DE.} \quad [5]$$

Apparatus 20 allows to calculate in parallel the following values: (a(n)+b(n)+DE)/2, the sign of (a(n)−b(n)−DE) and the sign of (b(n)−a(n)−DE) and to determine, according to said values which of following values to provide as a result of the calculation: a(n), b(n) and (a(n)+b(n)+DE)/2.

Accordingly, apparatus 20 comprises of first means 21 for calculating the following values: (a(n)+b(n)+DE)/2, the sign of (a(n)−b(n)−DE) and sign of (b(n)−a(n)−DE) and a second means 29 to determine which of the following elements to provide (a(n), b(n) or (a(n)+b(n)+DE)/2) as a result, according to said sign values.

First means 21 comprising of first to second subtracting units 22–23, adder 24. First and second subtracting units 22–23 and adder 24 receive a(n), b(n) and DE. Adder 24 receives a(n), b(n) and DE and provides to second means 29 (a(n)+b(n)+DE)/2. The division by two is a shift of the bit position by one. First subtracting unit 22 generates sign(b (n)−a(n)−DE). Second subtracting unit 23 generates sign(a (n)−b(n)−DE). Both sign signals are provided to control inputs of second means 29. Second means 29 is conveniently a multiplexer that receives a(n), b(n) and (a(n)+b(n)+DE)/2 and selects which signal to provide according to said control signals.

Conveniently, apparatus 20 performs said calculation in a single clock cycle.

Figure 4:
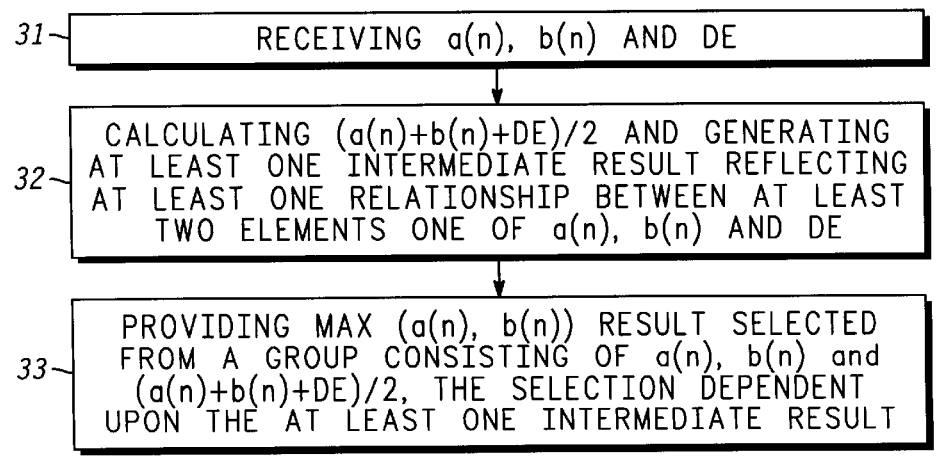
FIG. 4 is a flow chart illustrating a method for implementing a linearly approximated Log MAP algorithm, according to a preferred embodiment of the invention.

FIG. 4 is a flow chart illustrating a method 30 for implementing a linearly approximated Log MAP algorithm.

Method 30 starts at step 31 of receiving a(n) and b(n).

Step 31 is followed by step 32 of calculating (a(n)+b(n)+ DE)/2 and determining at least one intermediate result reflecting at least one relationship between a(n), b(n) and DE.

Step 32 is followed by step 33 of providing a one of the values of a(n), b(n) or (a(n)+b(n)+DE)/2, dependent upon the at least one intermediate result.

It should be noted that the particular terms and expressions employed and the particular structural and operational details disclosed in the detailed description and accompanying drawings are for illustrative purposes only and are not intended to in any way limit the scope of the invention as described in the appended claims.

Thus, there has been described herein an embodiment including at least one preferred embodiment of an apparatus and method for implementing a fast Log-MAP (Maximum-a-Posteriori) algorithm for turbo decoding and turbo equalization.

It will be apparent to those skilled in the art that the disclosed subject matter may be modified in numerous ways and may assume many embodiments other than the preferred form specifically set out and described above.

Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

What is claimed is:

1. A method for implementing a linearly approximated Log MAP algorithm, said implementation involves calculating MAX*(a(n),b(n)) function, said method comprising the steps of:

receiving a(n), b(n) and a value DE where DE is a threshold value for |a(n)−b(n)|;

calculating (a(n)+b(n)+DE)/2 and generating at least one intermediate result, said at least one intermediate result reflecting at least one relationship between at least two elements out of a(n), b(n) and DE;

providing an MAX*(a(n),b(n)) result selected from a group comprising of a(n), b(n) or (a(n)+b(n)+DE)/2, said selection dependent upon the at least one intermediate result; and performing decoding of a received signal using the provided MAX*(a(n),b(n)).

2. The method of claim 1 wherein the linearly approximated Log MAP algorithm is implemented in a iterative decoding process.

3. The method of claim 1 wherein the linearly approximated Log MAP algorithm is implemented in an iterative equalization process.

4. The method of claim 1 wherein a first intermediate result indicates whether an absolute value of a difference between a(n) and b(n) is greater than DE.

5. The method of claim 1 a second intermediate result indicates whether a(n) is greater than b(n).

6. The method of claim 5 wherein a first intermediate result indicates whether an absolute value of a difference between a(n) and b(n) is greater than DE.

7. The method of claim 1 wherein the at least one intermediate result comprising of a sign(a(n)−b(n)−DE) signal and a sign(b(n)−a(n)−DE) signal.

8. The method of claim 1 wherein the at least one intermediate result comprising of a sign(a(n)−b(n)) signal and a sign(|a(n)−b(n)|−DE) signal.

9. The method of claim 1 wherein said method is executed during 2–3 clock cycles.

10. The method of claim 1 wherein the MAX*(a(n),b(n)) result equals MAX(a(n),b(n)) when |a(n)−b(n)| is not smaller than DE, and equals (a(n)+b(n)+DE)/2 when |a(n)−b(n)| is smaller than DE.

11. The method of claim 1 wherein the MAX*(a(n),b(n)) result equals a(n) when (a(n)−b(n)−DE)>0 and (b(n)−a(n)−DE)<0; wherein the MAX*(a(n),b(n)) result equals b(n) when (a(n)−b(n)−DE)<0 and (b(n)−a(n)−DE)>0; and wherein the MAX*(a(n),b(n)) result equals (a(n)+b(n)+DE)/2 when (a(n)−b(n)−DE)<0 and (b(n)−a(n)−DE)<0.

12. A method for implementing a linearly approximated Log MAP algorithm, said implementation involves calculating MAX*(a(n),b(n)) function, said method comprising the steps of:

receiving a(n),b(n) and a value DE where DE is a threshold value for |a(n)−b(n)|;

calculating (a(n)+b(n)+DE)/2, sign(a(n)−b(n)); sign(a(n)−b(n)−DE) and sign(b(n)−a(n)−DE);

calculating MAX(a(n),b(n)), sign(|a(n)−b(n)|−DE), said first calculation based upon a(n), b(n) and sign(a(n)−b(n)), said second calculation based upon sign(a(n)−b(n), sign(a(n)−b(n)31 DE) and sign(b(n)−a(n)−DE);

providing an MAX*(a(n),b(n)) result selected from a group consisting of max(a(n), b(n)) and (a(n)+b(n)+DE)/2, dependent upon sign(|a(n)−b(n)|−DE); and performing decoding of a received signal using the provided MAX*(a(n),b(n)).

13. The method of claim 12 wherein said method is executed during a single clock cycle.

14. The method or claim 12 wherein the MAX*(a(n),b)n)) result equals MAX(a(n),b(n)) when |a(n)−b(n)| is not smaller than DE, and equals (a(n)+b(n)+DE/2 when |a(n)−b(n)| is smaller than DE.

15. A method for implementing a linearly approximated Log MAP algorithm, said implementation involves calculating MAX*(a(n),b(n)) function, said method comprising the steps of:

receiving a(n), b(n) and a value DE where DE is a threshold value for |a(n)−b(n)|;

calculating (a(n)+b(n)−DE)/2, sign(a(n)−b(n)−DE) and sign(b(n)−a(n)−DE);

providing an MAX*(a(n),b(n)) result selected from a group consisting of a(n), b(n) and (a(n)+b(n)+DE)/2, dependent upon sign(a(n)−b(n)−DE) and sign(b(n)−a(n)−DE); and performing decoding of a received signal using the provided MAX*(a(n),b(n)).

16. The method of claim 15 wherein said method is executed during two clock cycles.

17. The method of claim 15 wherein the MAX*(a(n),b(n)) result equals a(n) when (a(n)−b(n)−DE)>0 and (b(n)−a(n)−DE)<0; wherein the MAX*(a(n), b(n)) result equals b(n) when (a(n)−b(n)−DE)<0 and (b(n)−a(n)−DE)>0; and wherein the MAX*(a(n), b(n)) result equals (a(n)+b(n)+DE)/2 when (a(n)−b(n)−DE)<0 and (b(n)−a(n)−DE)<0.

18. An apparatus for implementing a linearly approximated Log MAP algorithm, said implementation involves calculating MAX*(a(n),b(n)) function, said apparatus comprising the steps of:

calculating means for receiving a(n), b(n) and a value DE where DE is a threshold value for |a(n)−b(n)|; for calculating (a(n)+b(n)+DE)/2 and for generating at least one intermediate result, said at least one intermediate result reflecting at least one relationship between at least two elements our of a(n), b(n) and DE; and selecting means for providing an MAX*(a(n),b(n)) result selected from a group comprising of a(n), b(n) or (a(n)+b(n)+DE)/2, said selection dependent upon the at least one intermediate result.

19. The apparatus of claim 18 wherein the linearly approximated Log MAP algorithm is implemented in a iterative decoding process.

20. The apparatus of claim 18 wherein the linearly approximated Log MAP algorithm is implemented in an iterative equalization process.

21. The apparatus of claim 18 wherein a first intermediate result indicates whether an absolute value of a difference between a(n) and b(n) is greater than DE.

22. The apparatus of claim 18 a second intermediate result indicates whether a(n) is greater than b(n).

23. The apparatus of claim 22 wherein a first intermediate result indicates whether an absolute value of a difference between a(n) and b(n) is greater than DE.

24. The apparatus of claim 18 wherein the at least one intermediate result comprising of a sign(a(n)−b(n)−DE) signal and a sign(b(n)−a(n)) signal.

25. The apparatus of claim 18 wherein the at least one intermediate result comprising of a sign(a(n)−b(n)) signal and a sign(|a(n)−b(n)|−DE) signal.

26. The apparatus of claim 18 wherein said apparatus calculates the MAX*(a(n),b(n)) function during a single clock cycle.

27. The apparatus of claim 18 wherein the MAX*(a(n), b(n)) result equals MAX(a(n),b(n)) when |a(n)−b(n)| is nor smaller than DE, and equals (a(n)+b(n)+DE)/2 when |a(n)−b(n)| is smaller than DE.

28. The apparatus of claim 18 wherein the MAX*(a(n), b(n)) result equals a(n) when (a(n)−b(n)−DE)>0 and (b(n)−a(n)−DE)<0; wherein the MAX*(a(n), b(n)) result equals b(n) when (a(n)−b(n)−DE)<0 and (b(n)−a(n)−DE)>0; and wherein the MAX*(a(n), b(n)) result equals (a(n)+b(n)+DE)/2 when (a(n)−b(n)−DE)<0 and (b(n)−a(n)−DE)<0.

29. An apparatus for implementing a linearly approximated Log MAP algorithm, said implementation involves calculating MAX*(a(n),b(n)) function, said apparatus comprising of:

a first means for receiving $a(n)$, $b(n)$ and a value DE where DE is a threshold value for $|a(n)-b(n)|$, calculating $(a(n)+b(n)+DE)/2$, $\text{sign}(a(n)-b(n))$, $\text{sign}(a(n)-b(n)-DE)$ and $\text{sign}(b(n)-a(n)-DE)$;

calculating $\text{MAX}(a(n),b(n))$, $\text{sign}(|a(n)-b(n)|-DE)$, said first calculation based upon $a(n)$, $b(n)$ and $\text{sign}(a(n)-b(n))$, said second calculation based upon $\text{sign}(a(n)-b(n))$, $\text{sign}(a(n)-b(n)-DE)$ and $\text{sign}(b(n)-a(n)-DE)$; and a second means for providing an $\text{MAX}^*(a(n),b(n))$ result selected from a group consisting of $\max(a(n), b(n))$ and $(a(n)+b(n)+DE)/2$, dependent upon $\text{sign}(|a(n)-b(n)|-DE)$.

30. The apparatus of claim 29 wherein said apparatus is adapted to calculate $\text{MAX}^*(a(n),b(n))$ function during three clock cycles.

31. The apparatus of claim 29 wherein the $\text{MAX}^*(a(n), b(n))$ result equals $\text{MAX}(a(n),b(n))$ when $|a(n)-b(n)|$ is not smaller than DE, and equals $(a(n)+b(n)+DE)/2$ when $|a(n)-b(n)|$ is smaller than DE.

32. An apparatus for implementing a linearly approximated Log MAP algorithm, said implementation involves calculating $\text{MAX}^*(a(n),b(n))$ function, said apparatus comprising:

a first means for receiving $a(n)$, $b(n)$ and a value DE where DE is a threshold value for $|a(n)-b(n)|$, calculating $(a(n)+b(n)+DE)/2$, $\text{sign}(a(n)-b(n)-DE)$ and $\text{sign}(b(n)-a(n)-DE)$; and a second means for providing an $\text{MAX}^*(a(n),b(n))$ result selected from a group consisting of $a(n)$, $b(n)$ and $(a(n)+b(n)+DE)/2$, dependent upon $\text{sign}(a(n)-b(n)-DE)$ and $\text{sign}(b(n)-a(n)-DE)$.

33. The apparatus of claim 32 wherein the apparatus is adapted to calculate a $\text{MAX}^*(a(n), b(n))$ function in two clock cycles.

34. The apparatus of claim 32 wherein the $\text{MAX}^*(a(n), b(n))$ result equals $a(n)$ when $(a(n)-b(n)-DE)>0$ and $(b(n)-a(n)-DE)<0$; wherein the $\text{MAX}^*(a(n), b(n))$ result equals $b(n)$ when $(a(n)-b(n)-DE)<0$ and $(b(n)-a(n)-DE)>0$; and wherein the $\text{MAX}^*(a(n), b(n))$ result equals $(a(n)+b(n)+DE)/2$ when $(a(n)-b(n)-DE)<0$ and $(b(n)-a(n)-DE)<0$.

* * * * *

UNITED STATES PATENT AND TRADEMARK OFFICE
CERTIFICATE OF CORRECTION

PATENT NO. : 6,757,701 B2
DATED : June 29, 2004
INVENTOR(S) : Noam Sivan et al.

It is certified that error appears in the above-identified patent and that said Letters Patent is hereby corrected as shown below:

Column 7,
Line 50, delete "31".
Line 58, change "(a(n),b)n))" to -- (a(n),b(n)) --.
Line 60, change "(a(n)+b(n)+DE/2" to -- (a(n)+b(n)+DE)/2 --.

Column 8,
Line 26, change "our" to -- out --.

Column 9,
Line 8, change "(a(n),b(n)" to -- (a(n),b(n)) --.

Signed and Sealed this

Second Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,757,701 B2 Page 1 of 1
APPLICATION NO. : 09/923007
DATED : June 29, 2004
INVENTOR(S) : Noam Sivan et al.

It is certified that error appears in the above-identified patent and that said Letters Patent is hereby corrected as shown below:

In Line 44, claim 12, column 7:

Change ";" to --,--

Signed and Sealed this

Seventeenth Day of April, 2007

JON W. DUDAS
*Director of the United States Patent and Trademark Office*